United States Patent Office 3,565,704

Patented Feb. 23, 1971

3,565,704

ALUMINUM NITRIDE FILMS AND PROCESSES FOR PRODUCING THE SAME

Ting Li Chu, Pittsburgh, Pa., assignor to Westinghouse Electric Corporation, Pittsburgh, Pa., a corporation of Pennsylvania No Drawing. Filed Dec. 19, 1967, Ser. No. 691,695
Int. Cl. H01l 7/36
U.S. Cl. 148—174 10 Claims

ABSTRACT OF THE DISCLOSURE

Processes for producing films of aluminum nitride in a flow system and in a closed system. In the flow system the ammonolysis of an aluminum trihalide or an aluminum trialkyl is capable of producing films of single crystal aluminum nitride suitable for use in junction devices or films of amorphous aluminum nitride suitable for use as a dielectric in electronic devices. In the closed system, aluminum nitride from a suitably located source is transported by either a hydrogen halide or an ammonium halide to a suitable substrate maintained at a lower temperature where a film of aluminum nitride is formed on the substrate.

BACKGROUND OF THE INVENTION

(1) Field of the Invention

This invention relates to films of aluminum nitride and processes for producing the same.

(2) Descripiton of the Prior Art

Aluminum nitride is a refractory material which has chemical, physical and electrical properties suitable for its application in electronic devices. Single crystals of aluminum nitride are grown by a vaporization of aluminum in a nitrogen atmosphere at from 1800° C. to 2000° C. Since aluminum nitride is a refractory material, however, the fabrication of aluminum nitride junctions by conventional alloying and diffusion techniques, necessary to produce radiation detectors and rectifiers for example, is difficult and complicated. An epitaxial growth process is more useful for electronic device fabrication as it enables one to form p-n junction structures at considerably lower temperatures provided suitable chemical reactions and growth techniques are available.

SUMMARY OF THE INVENTION

This invention provides a process for the deposition of aluminum nitride on a surface of a suitable substrate, the process comprising heating a substrate to a predetermined temperature within a reaction chamber, vaporizing a source material, chemically reacting the vaporized source material with a gaseous material, and depositing aluminum nitride on at least a predetermined surface of the heated substrate.

An object of this invention is to produce an aluminum nitride film on a suitable substrate surface.

Another object of this invention is to grow an epitaxial film of aluminum nitride on a suitable substrate surface by the ammonolysis of aluminum trihalides or aluminum trialkyls.

A further object of this invention is to grow film of aluminum nitride on a suitable substrate by the chemical transport technique using hydrogen halides and ammonium halides as a transport agent.

Other objects of this invention will, in part, be obvious and will, in part, appear hereinafter.

DESCRIPTION OF THE INVENTION

The use of chemical reactions of gaseous reactants on substrate surfaces in a gas flow system is a flexible technique for the deposition of refractory materials. Employing this technique one is able to deposit aluminum nitride on a suitable substrate by the ammonolysis of aluminum trihalides.

In the gas flow system, it is possible to clean the substrate surface upon which the aluminum nitride is to be deposited in situ prior to the deposition process. Apparatus suitable for the growth of aluminum nitride films by this gas flow system comprises such, for example, as a clean fused quartz tube. Within this quartz tube the required chemical reaction will occur and form the film of aluminum nitride on the surface of a suitable substrate.

The substrate is placed on a susceptor within the tube. The substrate comprises a monocrystalline material selected from the group consisting of silicon, silicon carbide, and aluminum nitride. When the substrate comprises silicon, a layer of amorphous silicon may first be deposited on the substrate if so desired. The susceptor is one selected from the group consisting of a tantalum nitride coated tantalum susceptor or an aluminum nitride coated tantalum susceptor. The susceptor is heated by a plurality of coils mounted externally about the tube and connected electrically to a radio frequency generator.

The substrate is heated to a temperature of approximately 1300° C. A gas selected from the group consisting of hydrogen, nitrogen, argon, and helium is flowed through the tube and over the substrate for at least 10 minutes. The flow of gas flushes the growth system of possible contaminants and cleans at least the surface of the substrate upon which the growth of the aluminum nitride layer is to be practiced.

The temperature of the substrate is adjusted to a temperature of from approximately 1000° C. to approximately 1350° C. as determined by an optical pyrometer. A reactant gas mixture is introduced into the reaction tube. The reactant gas mixture comprises ammonia and an aluminum trihalide such, for example, as aluminum tribromide, aluminum trichloride, and aluminum triiodide. The reactant gas mixture of ammonia and the aluminum trihalide react with each other quite rapidly thereby requiring the tube to be maintained at a temperature of at least 350° C. in order to prevent the condensation of aluminum trihalide-ammonia complexes on the walls of the quartz tube adjacent to the ports introducing the reactant materials into the tube. The gas flow rate of ammonia varies from approximately 0.2 mole per minute to approximately 0.4 mole per minute. The gas flow rate of the aluminum trihalide varies from $4\times10^{-4}$ moles per minute to $1\times10^{-3}$ moles per minte.

The aluminum trihalide reactant gas is formed by passing a gas, preferably the same gas employed to clean the substrate, through a container of an aluminum trihalide. The container of material is preferably maintained at a temperature range of approximately 130° C. to 150° C. in order to provide a sufficient vapor pressure for the aluminum trihalide. The line connecting the container to the tube is maintained within the same temperature range as the container in order to prevent the condensation of the aluminum trihalide material within the line.

The aluminum trihalide reacts with the ammonia within the tube and deposits aluminum nitride on at least the clean surface of the substrate. Employing the gas flow rates for each of the reactants as well as the substrate temperatures, as disclosed heretofore, the aluminum nitride is deposited at a rate of from approximately 1 micron per hour to 12 microns per hour regardless of the material comprising the substrate.

Similarly, aluminum nitride may also be deposited in a gas flow system by the ammonolysis of aluminum trialkyls, such, for example, as aluminum triethyl.

The aluminum nitride grown on the substrate may be suitably doped as it is growing by introducing a suitable dopant material into the reactant gas stream. The concentration of the dopant impuirity is controlled by regulating its flow into the reactant gas stream. Hydrogen selenide introduced into the reactant gas stream enables one to grow n-type aluminum nitride. P-type aluminum nitride is grown by introducing a Group II element of the Periodic Table of Elements such, for example, as zinc, cadmium, or mercury into the reactant gas stream. Mercury vapor is particularly convenient for this purpose. Thus, for example, the epitaxial deposition of n-type aluminum nitride on either p-type aluminum nitride or p-type silicon carbide substrate produces rectifying junctions.

In either case, the growth of aluminum nitride on the substrate will be epitaxial provided the lattice constant of the material comprising the substrate is the same as, or very similar to, the lattice constant of the aluminum nitride. Therefore, aluminum nitride grown on monocrystalline silicone carbide and aluminum nitride substrate is single crystalline and epitaxial when grown under the conditions described heretofore. Aluminum nitride grown on a monocrystalline substrate comprising silicon is neither single crystalline nor epitaxial with respect to the substrate. Aluminum nitride grown on a silicon dioxide coated silicon substrate is amorphous.

The deposition of aluminum nitride from a gas flow system on a substrate whose crystalline structure is such as to prevent epitaxial growth thereon enables one to establish a capability of fabricating metal-insulator-silicon (MIS) capacitors. The unmatched crystalline structures provides a means for one to deposit amorphous aluminum nitride on a silicon wafer or a silicon dioxide coated wafer of a silicon and then evaporate aluminum metal on the amorphous aluminum nitride thereby forming a MIS capacitor. Employing the gas flow system heretofore described one deposits aluminum nitride on a silicon substrate until a layer 1000 A. in thickness is achieved. An aluminum contact, 1000 A. thick is then vapor deposited on thealuminum nitride. The resulting MIS capacitor does not possess charge instabilities observed in silicon-silicon nitride structures. Additionally, the voltage at which the transition between high insulator capacitance and low depletion state value occurs (the flat-band voltage) in the capacitor made in accordance with the teachings of the invention, is approximately 2.5 volts in comparison to about 10 volts for a MIS capacitor comprising a silicon nitride film. Therefore the interface state density in silicon-aluminum nitride structures, and consequently the threshold voltage in surface controlled field-effective devices, utilizing aluminum nitride as the dielectric, is several times lower than that which is found in devices employing silicon nitride as the dielectric.

The following examples are illustrative of the teachings of this invention in which aluminum nitride films are grown by the ammonolysis of an aluminum trihalide:

EXAMPLE I

A substrate of single crystal silicon carbide was placed on a susceptor comprising tantalum coated with aluminum nitride within a clean quartz tube 45 mm. I.D. and 3 feet in length. The tube was heated to, and maintained at, 350° C., by using resistance heaters. The substrate was heated to approximately 1300° C. Hydrogen gas was flowed through the tube for approximately 10 minutes as the substrate was maintained at the elevated temperature.

After hydrogen had flowed through the tube for apprroximately 10 minutes, the substrate temperature was adjusted to 1000° C. Ammonia was flowed through the tube at a rate of 10 liters per minute. A container of aluminum trichloride was heated to, and maintained at, a temperature range of from 130° C. to 150° C. Hydrogen flowed through the container of aluminum trichloride and, acting as a carrier gas, carried vaporized aluminum trichloride through a connecting line into the tube. The connecting line was also maintained within the temperature range of 130° C. to 150° C. The flow of hydrogen and aluminum trichloride was adjusted to allow a flow of aluminum trichloride of $8\times10^{-4}$ moles per minute. Under these conditions the reactant gas mixture had an aluminum trichloride to ammonia ratio of $1.8\times10^{-3}$.

Under these conditions the aluminum nitride film was grown on the substrate at a rate of approximately 12 microns per hour. The structure was polycrystalline.

The substrate temperature was measured by an optical pyrometer.

EXAMPLE II

The process of Example I was repeated except that the temperature of the substrate during the growth of the aluminum nitride film was 1250° C.

Under these conditions the growth of the aluminum nitride film was approximately 3 microns per hour. The grown layer of aluminum nitride appeared smooth and exhibited no structural features when examined with an optical microscope.

The process of this example was repeated several times. The surface of each grown layer was etched with a 50% sodium hydroxide solution. In several instances, the entire surface exhibited a number of linear etch figures at 60° and 120° to each other which sometimes intersected to form triangles or partial triangles. These figures were traces of intersections of stacking fault planes with the grown surface. The geometry of the etched figures showed that the grown layer in each instance was single crystal material and that the grown material was epitaxial relative to the substrate.

Electron diffraction examination verified the findings that each of the grown layers of aluminum nitride was epitaxial.

EXAMPLE III

The process of Example I was repeated except that the temperature of the substrate during the growth of the aluminum nitride film was 1350° C.

The deposition rate of the aluminum nitride decreased to approximately 1.5 microns per hour. The aluminum nitride grown was an epitaxial growth but the quality of the growth material was not as good as that obtained in a substrate temperature range of approximately 1200° C. to 1250° C.

EXAMPLE IV

The process of Example II was repeated except that hydrogen selenide was introduced into the reactant gas stream of aluminum trichloride and ammonia. The flow rate of hydrogen selenide was $2\times10^{-6}$ moles per minute.

The growth of the aluminum nitride film was still approximately 3 microns per hour and its structure was epitaxial with respect to the substrate. A check with a cold probe tester showed the grown aluminum nitride layer had n-type conductivity.

EXAMPLE V

The process of Example II was repeated except that mercury vapor was introduced into the reactant gas stream of aluminum trichloride and ammonia. The flow of mercury vapor was $10^{-5}$ moles per minute.

The growth of the aluminum nitride film was still approximately 3 microns per hour and its structure was epitaxial with respect to the substrate. A check with a cold probe tester showed the grown aluminum nitride layer had a p-type conductivity.

From the results obtained from numerous growth experiments the optimum substrate temperature for the epitaxial growth of aluminum nitride is within the range of approximately 1200° C. to 1250° C. In this temperature range, good quality epitaxial layers up to 25 microns in thickness have been obtained at growth rates of 4 microns per hour and higher. At higher temperatures, the contribution of homogeneous nucleation through ammonolysis in the gas phase becomes increasingly important and results in lower deposition rates and aluminum nitride films of inferior quality.

Another method of depositing aluminum nitride on a suitable substrate surface is by practicing the chemical transport technique in which aluminum nitride is transported from a source material and deposited on the substrate. It is found that hydrogen halides react reversibly with aluminum nitride according to the reaction $$2AlN(s)+6HX(g)\rightleftarrows 2AlX_3(g)+N_2(g)+3H_2(g)$$

In place of the hydrogen halide, an ammonium halide has been found to be a suitable transport agent. The ammonium halide is equivalent to the use of a mixture of hydrogen, nitrogen, and hydrogen halide as a transport agent. The transport of aluminum nitride can be carried out in either a closed system or an open system.

In a closed system, a fused silica reaction tube can be used. Polycrystalline lumps of aluminum nitride are placed in one end of the tube. A suitable monocrystalline substrate such, for example, as one selected from the group consisting of silicon carbide and aluminum nitride, is placed in the opposite end of the tube. The tube is attached to a vacuum manifold and evacuated to $10^{-5}$ Torr or less. A transport agent, such, for example, as a gas selected from the group consisting of hydrogen halides and ammonium halides, is admitted to the tube to a known pressure. The tube is then sealed.

After sealing the tube is placed in a horizontal tube furnace containing two independently-controlled temperature zones. The source material of aluminum nitride is maintained at a temperature range of 1050° C. to 1200° C. The temperature of the one, or more, substrate(s) is maintained at a range of approximately 30°–50° C. lower than the temperature of the source material.

The following examples illustrate the growth of aluminum nitride films by the chemical transport technique:

EXAMPLE VI

A fused quartz reaction tube having an inside diameter of 3 centimeters was employed in a closed system process. Polycrystalline lumps of aluminum nitride were placed within one end of the reaction tube. At the other end of the reaction tube a substrate comprising single crystal silicon carbide was placed. The tube was then evacuated to $10^{-5}$ torr and hydrogen chloride was distilled into the tube until a pressure of ½ atmosphere was reached. The tube was sealed, yielding a reaction tube approximately 25 centimeters in length. The tube was placed in a furnace which had two independently controlled temperature zones. The source material, aluminum nitride, was heated to and maintained at, a temperature of 1085° C.±5° C. The substrate was maintained at an elevated temperature of 1050° C.±5° C. The elapsed time of the experiment was 96 hours.

Upon cooling to room temperature, the substrate was removed and examined. The film grown on the substrate was highly adherent. It measured 8 microns in thickness, and it was found that the film consisted of aluminum nitride by employing X-ray diffraction techniques.

EXAMPLE VII

The process of Example VI was repeated except that hydrogen bromide was substituted for the hydrogen chloride as a transport agent.

The grown material on the substrate was a layer of aluminum nitride 8 microns in thickness.

EXAMPLE VIII

The process of Example VI was repeated except that ammonium chloride was substituted for the hydrogen chloride as a transport agent.

The grown material on the substrate was a layer of aluminum nitride 8 microns in thickness.

In a similar manner it has been determined that the deposition rate of aluminum nitride, and, therefore the quality of the aluminum nitride layer grown, is determined principally by the vapor pressure of the transport agent. As shown in Examples VI through VIII, the deposition rate of aluminum nitride is approximately 0.08 micron per hour when the vapor pressure of the transport agent is ½ atmosphere. Under these conditions the deposited films of aluminum nitride on all the substrates are highly adherent and uniform in quality. When the vapor pressure of the transport agent is 1.1 atmospheres, the deposition rate is 0.2 micron per hour and the aluminum nitride film becomes less adherent to the substrate on which it is grown. The vapor pressure of the transport agent may be as great as approximately 5 atmospheres. Although the greater vapor pressure enhances the growth of the aluminum nitride on the substrate, it also increases the possibility of an explosion because of the higher stress placed in the reactor chamber.

The same chemical transport technique can be employed to deposit amorphous aluminum nitride on a suitable substrate, such, for example, as silicon dioxide coated silicon, to fabricate dielectric devices.

While the present invention has been described in a few forms only, it will be understood of course that various changes and modifications may be made without departing from the spirit and scope thereof.

I claim as my invention:

1. A process for the deposition of aluminum nitride on a surface of a substrate, the process comprising,
- (a) heating the substrate to a predetermined temperature in the range of from 1000° C. to 1350° C.;
- (b) vaporizing a source material consisting of an aluminum compound selected from at least one of the group consisting of an aluminum trihalide and an aluminum trialkyl;
- (c) transporting the vaporized source material to the heated substrate by a gaseous material selected from at least one of the group consisting of hydrogen, nitrogen, argon, and helium; and
- (d) admixing ammonia gas with said vaporized source material in the vicinity of the surface of the heated substrate whereby a chemical reaction occurs producing and depositing aluminum nitride on a surface of the heated substrate.

2. The process of claim 1 in which:
the substrate comprises a material selected from the group consisting of monocrystalline silicon, monocrystalline silicon carbide, monocrystalline aluminum nitride, silicon having a layer of amorphous silicon disposed thereon, and silicon having a layer of silicon dioxide disposed thereon.

3. The process of claim 1 in which:
the source material is vaporized at a temperature of from 130° C. to 150° C.

4. The process of claim 3 in which:
the substrate is heated to a temperature range of approximately 1200° C. to 1250° C.

5. The process of claim 4 in which:
the source material is aluminum trichloride; and including flowing the aluminum trichloride at a gas flow rate of from $4\times10^{-4}$ moles per minute to $1\times10^{-3}$ moles per minute;
flowing the ammonia at a gas flow rate of from approximately 0.2 mole per minute to approximately 0.4 mole per minute; and
depositing aluminum nitride on at least one surface of the heated substrate at a rate of from 1 micron per hour to 12 microns per hour.

6. The process of claim 4 and including
introducing a dopant material into the vaporized source material whereby
the aluminum nitride deposit has a preferred type of conductivity.

7. The process of claim 6 in which:
the dopant material is one selected from the group consisting of zinc, cadmium and mercury, and the aluminum nitride deposit has p-type conductivity.

8. The process of claim 6 in which:

the dopant material is hydrogen selenide, and the aluminum nitride deposit has n-type conductivity.

9. The process of claim 2 and including:

heating the substrate initially to approximately 1300° C.; and passing a gas selected from the group consisting of hydrogen, nitrogen, argon and helium over the heated substrate for a predetermined time before adjusting the substrate temperature to the deposition temperature.

10. The process of claim 9 in which the gas is passed over the heated substrate for at least 10 minutes.

References Cited

UNITED STATES PATENTS

| | | | |
|---|---|---|---|
| 3,218,205 | 11/1965 | Ruehrwein | 148—174 |
| 3,224,911 | 12/1965 | Williams et al. | 148—175 |
| 3,224,913 | 12/1965 | Ruehrwein | 148—174 |
| 3,352,637 | 11/1967 | Heymer et al. | 23—192 |
| 3,364,084 | 1/1968 | Ruehrwein | 148—174 |
| 3,373,051 | 3/1968 | Chu et al. | 117—106 |

RICHARD O. DEAN, Primary Examiner

U.S. Cl. X.R.

148—175; 117—200, 106